(12) United States Patent
Fu et al.

(10) Patent No.: US 8,604,488 B2
(45) Date of Patent: Dec. 10, 2013

(54) LIGHT EMITTING DIODE AND FABRICATING METHOD THEREOF

(75) Inventors: Yi-Keng Fu, Hsinchu County (TW); Ren-Hao Jiang, Taichung (TW); Yen-Hsiang Fang, New Taipei (TW); Bo-Chun Chen, Tainan (TW); Chia-Feng Lin, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 115 days.

(21) Appl. No.: 13/365,217

(22) Filed: Feb. 2, 2012

(65) Prior Publication Data

US 2013/0112987 A1 May 9, 2013

(30) Foreign Application Priority Data

Nov. 7, 2011 (TW) .............................. 100140563 A

(51) Int. Cl.
*H01L 33/32* (2010.01)
(52) U.S. Cl.
USPC ..................................... 257/76; 257/E33.025
(58) Field of Classification Search
USPC ............................................. 257/76, E33.025
See application file for complete search history.

(56) References Cited

U.S. PATENT DOCUMENTS

| 7,491,914 | B2 | 2/2009 | Kim et al. | |
| 7,491,974 | B2 | 2/2009 | Nagai et al. | |
| 7,601,621 | B2 | 10/2009 | Choi et al. | |
| 7,687,376 | B2 | 3/2010 | Choi et al. | |
| 7,754,514 | B2 | 7/2010 | Yajima et al. | |
| 2008/0149959 | A1 | 6/2008 | Nakamura et al. | |
| 2010/0093124 | A1* | 4/2010 | Koukitu et al. | 438/46 |
| 2010/0255621 | A1* | 10/2010 | Minato et al. | 438/41 |

FOREIGN PATENT DOCUMENTS

CN 1886827 12/2006

OTHER PUBLICATIONS

Chia-Feng Lin et al., "Blue light-emitting diodes with a roughened backside fabricated by wet etching", Applied Physics Letters 95, 201102, 2009, p. 1-p. 3.
Chia-Feng Lin et al., "Fabrication of the InGaN-Based Light-Emitting Diodes Through a Photoelectrochemical Process", IEEE Photonics Technology Letters, vol. 21, No. 16, August 15, 2009, p. 1142-p. 1144.
Hock M. Ng et al., "GaN nanotip pyramids formed by anisotropic etching", Journal of Applied Physics, vol. 94, No. 1, Jul. 2003, p.650-p.653.

(Continued)

*Primary Examiner* — Whitney T Moore
(74) *Attorney, Agent, or Firm* — Jianq Chyun IP Office

(57) ABSTRACT

A light emitting diode including a GaN substrate, a first type semiconductor layer, a light emitting layer, a second type semiconductor layer, a first electrode, and a second electrode is provided. The GaN substrate has a first surface and a second surface opposite thereto, and the second surface has a plurality of protuberances, the height of the protuberance is h μm and the distribution density of the protuberance on the second surface is d $cm^{-2}$, wherein $9.87 \times 10^7 \leq h^2 d$, and $h \leq 1.8$. The first type semiconductor is disposed on the first surface of the GaN substrate. The light emitting layer is disposed on a partial region of the first semiconductor layer, and the wavelength of the light emitted by the light emitting layer is from 375 nm to 415 nm. The second semiconductor layer is disposed on the light emitting layer.

13 Claims, 11 Drawing Sheets

(56) References Cited

OTHER PUBLICATIONS

Chih-Chiang Kao et al., "Light-Output Enhancement in a Nitride-Based Light-Emitting Diode With 22° Undercut Sidewalls", IEEE Photonics Technology Letters, vol. 17, No. 1, Jan. 2005, p. 19-p. 21.

C. W. Kuo et al., "Optical Simulation and Fabrication of Nitride-Based LEDs With the Inverted Pyramid sidewalls", IEEE Journal of Selected Topics in Quantum Electronics, 2009, p. 1-p. 5.

* cited by examiner

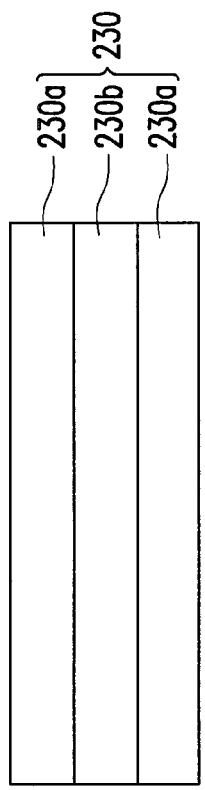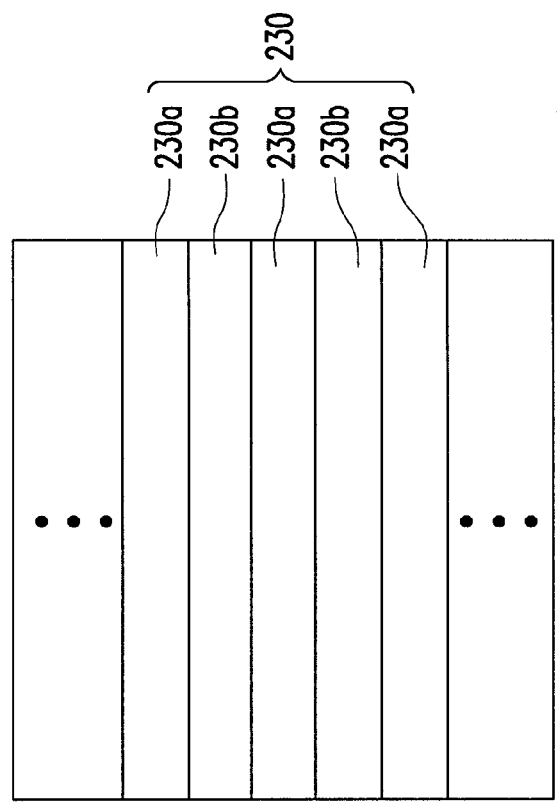

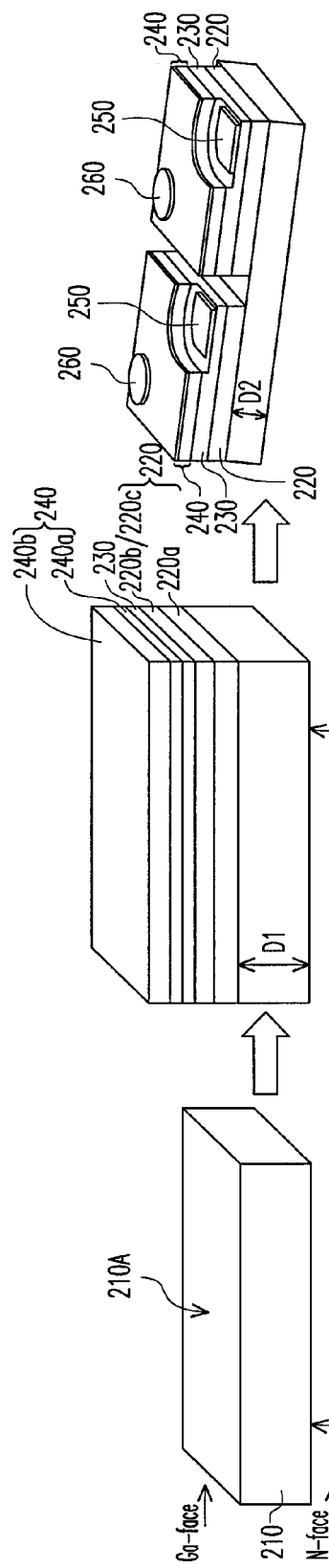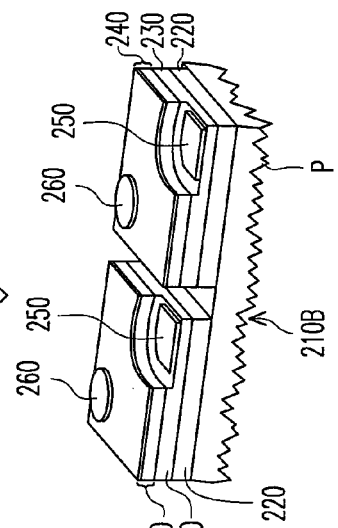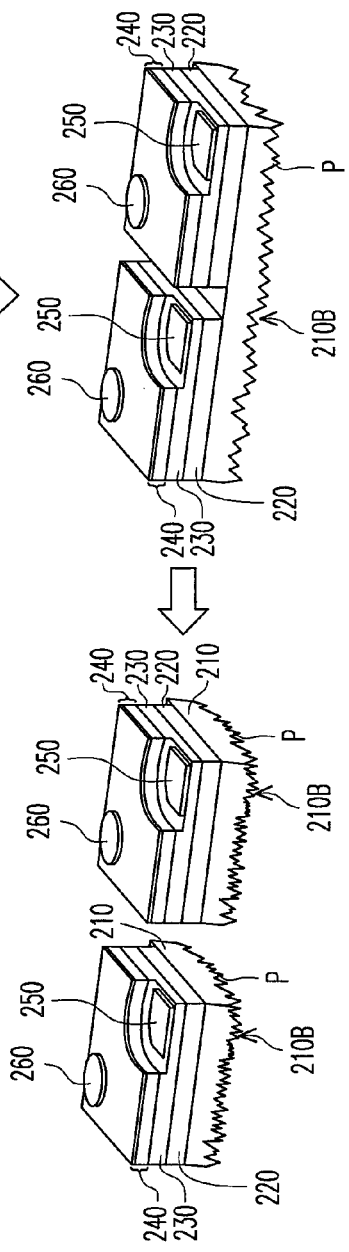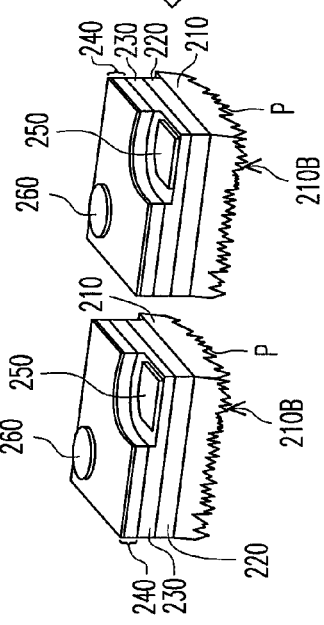

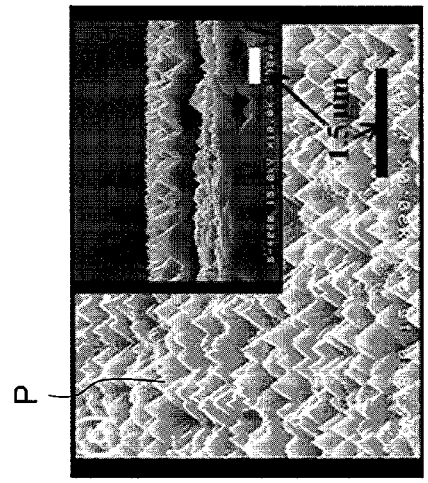
FIG.5A  FIG.5B  FIG.5C
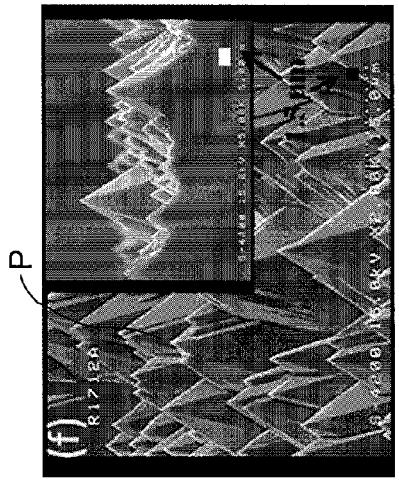
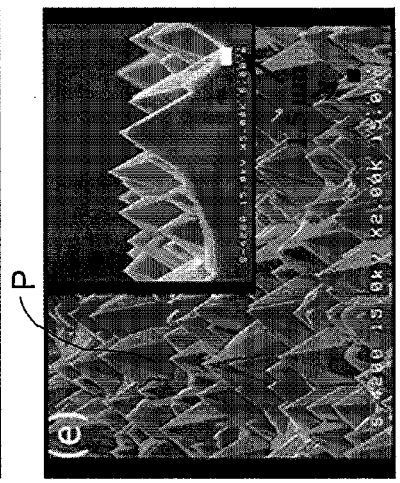
FIG.5D  FIG.5E  FIG.5F
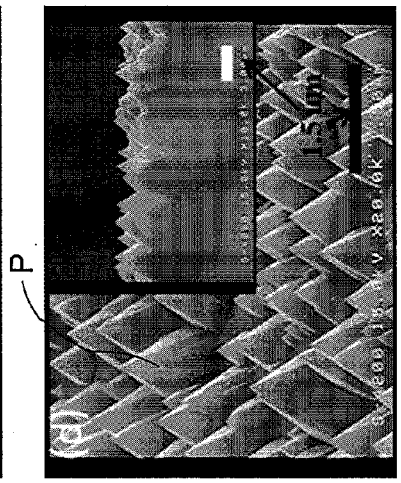

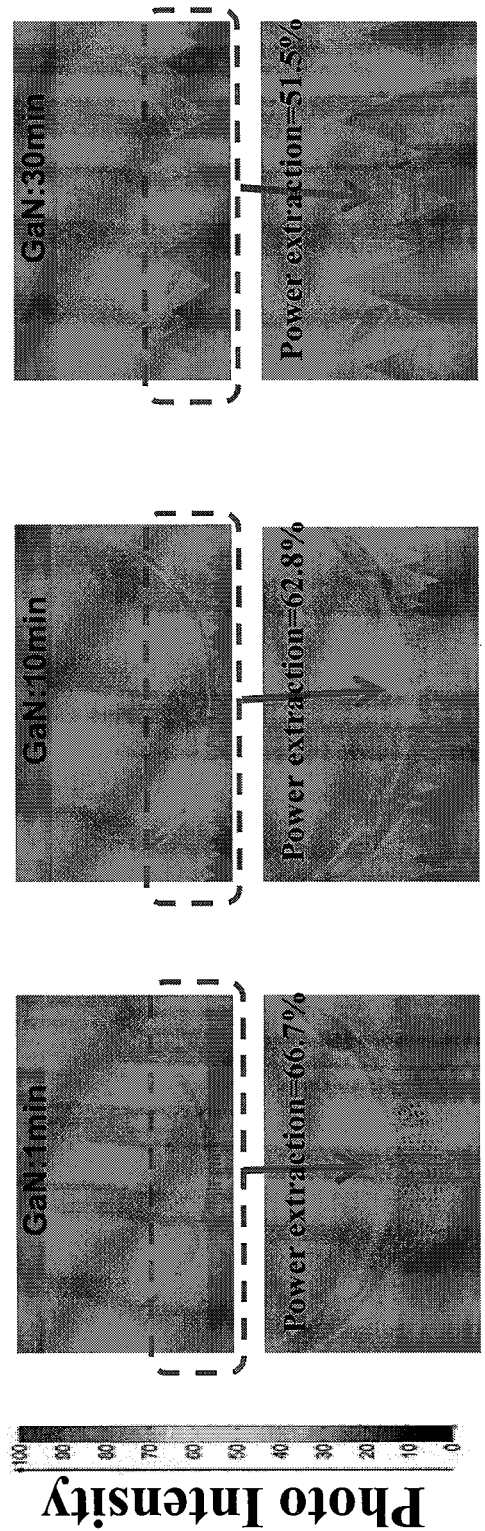

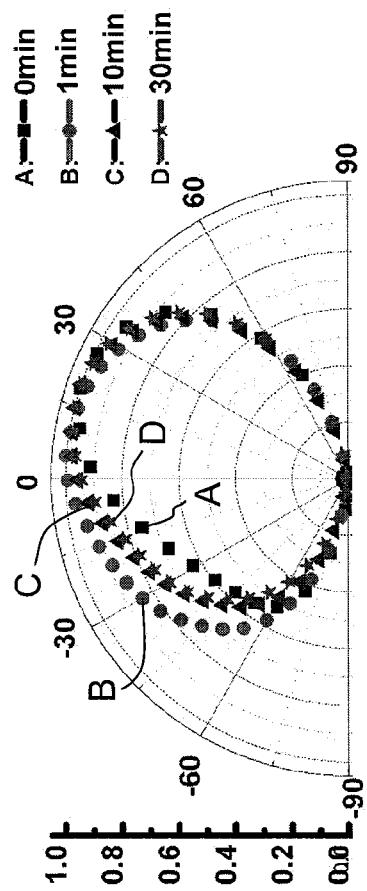
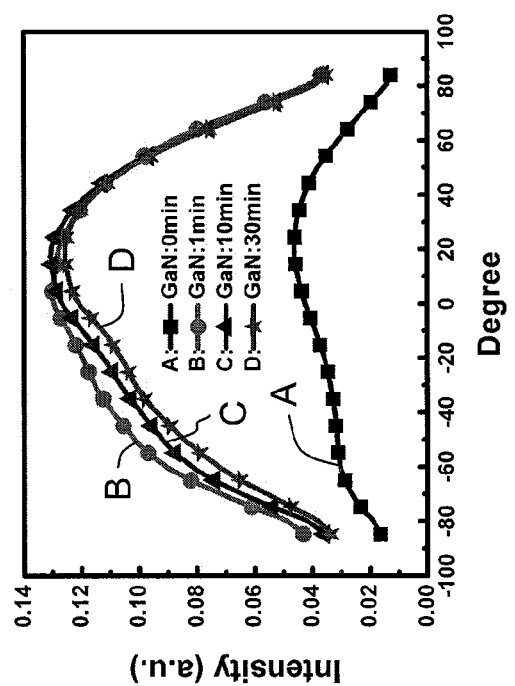
FIG.8B
FIG.8A

LIGHT EMITTING DIODE AND FABRICATING METHOD THEREOF

CROSS-REFERENCE TO RELATED APPLICATION

This application claims the priority benefit of Taiwan application serial no. 100140563, filed Nov. 7, 2011. The entirety of the above-mentioned patent application is hereby incorporated by reference herein and made a part of this specification.

BACKGROUND OF THE INVENTION

1. Technical Field

The technical field relates to a light emitting diode (LED) and a fabricating method thereof, and particularly to an LED and a fabricating method thereof capable of enhancing a light extraction efficiency.

2. Description of Related Art

A light emitting diode (LED) is a semiconductor device constituted mainly by, for example, group III-V compound semiconductor materials. Since such semiconductor materials have a characteristic of converting electricity into light, when a current is applied to the semiconductor materials, electrons therein are combined with holes and excessive energy are released in form of light, thereby achieving an effect of luminosity.

Sapphire is often used as an epitaxy substrate in an LED, generally speaking. Since sapphire is a transparent material, an LED fabricated by using sapphire would scatter light to all directions without focusing the light and resulting in waste. Meanwhile, the scattered light is absorbed by each semiconductor layer inside the LED and heat is accumulated. Therefore, the emitting luminosity and efficiency of the gallium nitride (GaN) LEDs are lowered.

Additionally, since the GaN serving as the material for the epitaxial layer in the LED and sapphire substrates have mismatching lattice constants of around 16%, a large quantity of defects occurs at lattice growth junction, thus drastically weakening the luminous intensity. Moreover, the sapphire substrates adopted in conventional LEDs have lower heat dissipation coefficients than the GaN substrates, therefore due to the heat buildup, the luminous intensity is easily reduced.

Moreover, because of the difference between the indices of refraction of GaN and air, merely 4.54% of light generated in the LED can be successfully emitted from the GaN surface to the air. Therefore, the low light extraction efficiency causes drastic reduction in the external quantum efficiency of the LED, and accordingly the industry is earnestly pursuing an LED with high light extraction efficiency.

SUMMARY OF THE INVENTION

The disclosure is directed to a light emitting diode (LED) capable of adjusting a total reflection angle of light to enhance a light extraction efficiency.

An LED is provided in the disclosure, including a gallium nitride (GaN) substrate, a first type semiconductor layer, a light emitting layer, a second type semiconductor layer, a first electrode, and a second electrode. The GaN substrate includes a first surface and a second surface, in which the first surface and the second surface are disposed on two sides of the GaN substrate, and the second surface has a plurality of protuberances. A height of the protuberances is h μm, and a distribution density of the protuberances on the second surface is d cm$^{-2}$, in which $h^2 d \geq 9.87 \times 10^7$, and $h \leq 1.8$. The first type semiconductor layer is disposed on the first surface of the GaN substrate. The light emitting layer is disposed on a partial portion of the first type semiconductor layer, and a wavelength of a light emitted by the light emitting layer is from 375 nm to 415 nm. The second type semiconductor layer is disposed on the light emitting layer. The first electrode is disposed on a partial region of the first type semiconductor layer, and the second electrode is disposed on a partial region of the second type semiconductor layer.

Another LED is provided in the disclosure, including a GaN substrate, a first type semiconductor layer, a light emitting layer, a second type semiconductor layer, a first electrode, and a second electrode. The GaN substrate includes a first surface and a second surface, in which the first surface and the second surface are disposed on two sides of the GaN substrate, and the second surface has a plurality of protuberances. A height of the protuberances is h μm, and a distribution density of the protuberances on the second surface is d cm$^{-2}$, in which $h^2 d \geq 9.87 \times 10^7$, and $d \geq 8 \times 10^8$. The first type semiconductor layer is disposed on the first surface of the GaN substrate. The light emitting layer is disposed on a partial portion of the first type semiconductor layer, and a wavelength of a light emitted by the light emitting layer is from 375 nm to 415 nm. The second type semiconductor layer is disposed on the light emitting layer. The first electrode is disposed on a partial region of the first type semiconductor layer, and the second electrode is disposed on a partial region of the second type semiconductor layer.

Another LED is provided in the disclosure, including a GaN substrate, a first type semiconductor layer, a light emitting layer, a second type semiconductor layer, a first electrode, and a second electrode. The GaN substrate includes a first surface and a second surface, in which the first surface and the second surface are disposed on two sides of the GaN substrate, and the second surface has a plurality of protuberances. A height of the protuberances is h μm, and a distribution density of the protuberances on the second surface is d cm$^{-2}$, in which $3 \leq h \leq 6$, and $1.5 \times 10^6 \leq d \leq 7.5 \times 10^6$. The first type semiconductor layer is disposed on the first surface of the GaN substrate. The light emitting layer is disposed on a partial portion of the first type semiconductor layer, and a wavelength of a light emitted by the light emitting layer is from 375 nm to 415 nm. The second type semiconductor layer is disposed on the light emitting layer. The first electrode is disposed on a partial region of the first type semiconductor layer, and the second electrode is disposed on a partial region of the second type semiconductor layer.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

FIG. 2A is a schematic cross-sectional view of a SQW light emitting layer in an LED according to an exemplary embodiment.

FIG. 2B is a schematic cross-sectional view of a MQW light emitting layer in an LED according to an exemplary embodiment.

FIGS. 3A-3E are schematic cross-sectional views of a fabricating process of an LED according to an exemplary embodiment.

FIGS. 5A-5F respectively illustrates experiments forming different types of protuberances on the GaN substrate according to an exemplary embodiment.

FIGS. 6A-6C respectively illustrates simulation views of the far-field angle of an LED having different types of protuberances formed by different etch times according to an exemplary embodiment.

FIGS. 8A and 8B are optical performance diagrams of the far-field angle relative of an LED adopting the second surface having different types of protuberances formed by the different etch times listed in Table 2.

DETAILED DESCRIPTION OF DISCLOSED EMBODIMENTS

Figure 1A:
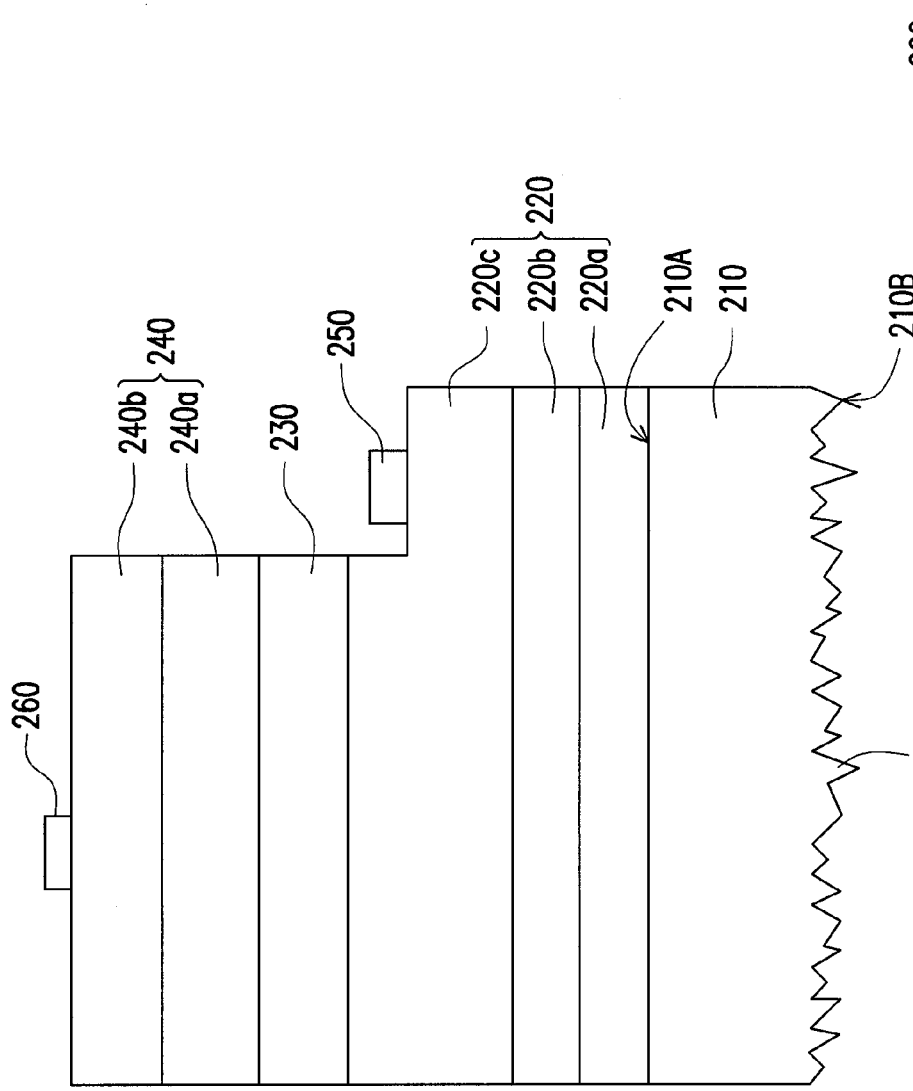
FIGS. 1A and 1B are schematic cross-sectional views respectively illustrating an LED according to an exemplary embodiment.
Figure 1B:
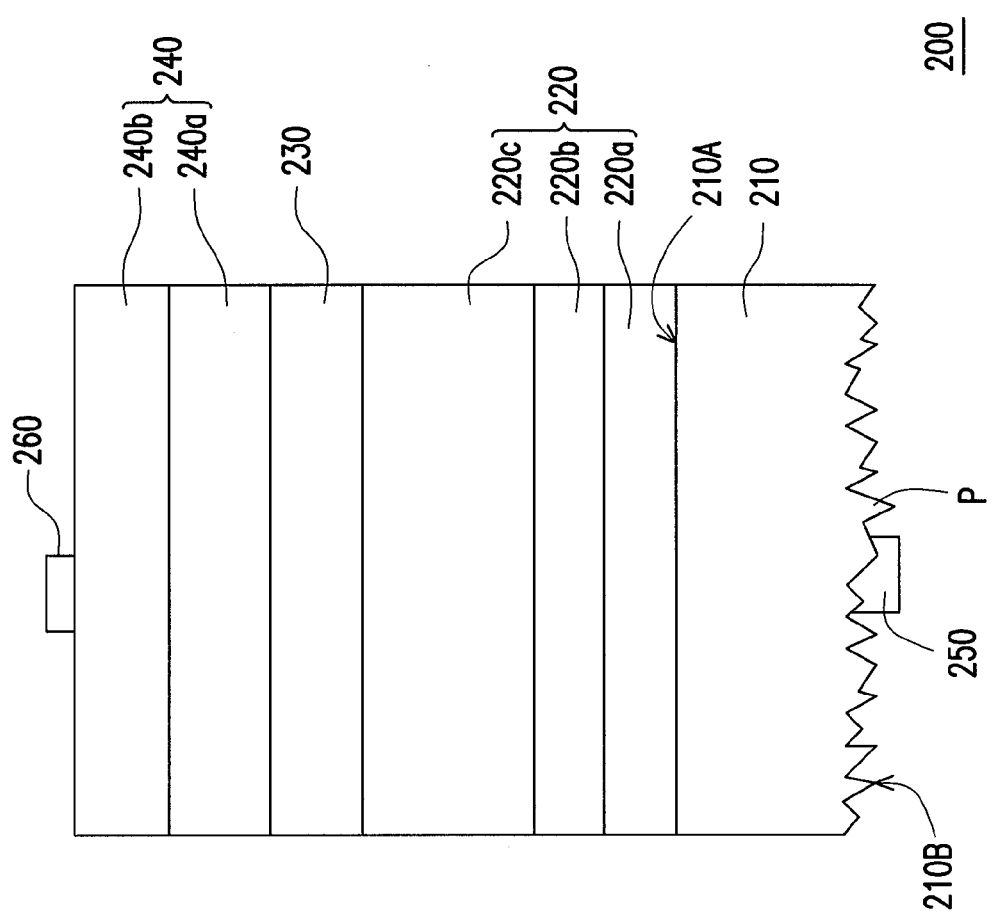

FIGS. 1A and 1B are schematic cross-sectional views respectively illustrating an LED according to an exemplary embodiment.

Referring to FIG. 1A, an LED 200 includes a GaN substrate 210, a first type semiconductor layer 220, a light emitting layer 230, a second type semiconductor layer 240, a first electrode 250, and a second electrode 260. The GaN substrate 210 has a first surface 210A and a second surface 210B, and in the present embodiment, the second surface 210B is a nitride surface of the GaN substrate 210, for example. The first type semiconductor layer 220, the light emitting layer 230, and the second type semiconductor layer 240 are stacked in sequence on the first surface 210A of the GaN substrate 210. The first type semiconductor layer 220 is disposed on the first surface 210A of the GaN substrate 210, and the light emitting layer 230 is disposed on a partial region of the first type semiconductor layer 220. The second type semiconductor layer 240 is disposed on the light emitting layer 230. Moreover, the first electrode 250 is disposed on the partial region of the first type semiconductor layer 220 to electrically connect to the first type semiconductor layer 220. The second electrode 260 is disposed on a partial region of the second type semiconductor layer 240 to electrically connect to the second type semiconductor layer 240. Moreover, a stacked pattern of the afore-described film layers may be as depicted in FIG. 1B, in which the first electrodes 250 and the second electrodes 260 are respectively disposed on two opposite sides of the stacked layers constituted by the second type semiconductor layer 240, the light emitting layer 230, the first type semiconductor layer 220, and the GaN substrate 210.

Moreover, the first electrode 250 is disposed on the second surface 210B of the GaN substrate 210, although the disclosure is not limited thereto.

In the present embodiment, the first type semiconductor layer 220 is an n-type semiconductor, for example, including an undoped GaN layer 220a, a first n-type doped GaN layer 220b, and a second n-type doped GaN layer 220c stacked in sequence on the GaN substrate 210. Moreover, the first n-type doped GaN layer 220b and the second n-type doped GaN layer 220c may have different thicknesses or dopant concentrations. On the other hand, the second type semiconductor layer 240 may be a p-type semiconductor layer, for example, including a first p-type doped GaN layer 240a and a second p-type doped GaN layer 240b stacked in sequence on the light emitting layer 230. The thickness or the dopant concentration of the first p-type doped GaN layer 240a is different from the second p-type doped GaN layer 240b.

Moreover, in the present embodiment, the light emitting layer 230 may be a single quantum well (SQW) light emitting layer 230 or a multiple quantum well (MQW) light emitting layer 230. Specifically, as shown in FIGS. 2A and 2B, FIG. 2A is a schematic cross-sectional view of a SQW light emitting layer in an LED according to an exemplary embodiment, and FIG. 2B is a schematic cross-sectional view of a MQW light emitting layer in an LED according to an exemplary embodiment. As shown in FIG. 2A, the SQW light emitting layer 230 may be formed by a plurality of quantum barrier layers 230a and quantum wells 230b, for example by stacking quantum barrier layer 230a/quantum well 230b/quantum barrier layer 230a. With an ultraviolet LED 200 for example, a material of the quantum wells 230b may be, for instance, $Al_xIn_yGa_{1-x-y}N$, in which $0 \le x \le 1$ and $0 \le y \le 1$, and persons skilled in the art may select the growth quantities of x and y based on practical requirements, so the disclosure is not limited thereto. Moreover, as shown in FIG. 2B, the MQW light emitting layer 230 may be formed by at least two pairs of stacked quantum barrier layers 230a and quantum wells 230b, for example by repeatedly stacking quantum barrier layer 230a/quantum well 230b as depicted in FIG. 2B.

It should be noted that, referring to FIGS. 1A and 1B, in the LED 200 according to an exemplary embodiment of the disclosure, a thickness of the GaN substrate 210 is between 70 nm to 120 nm, and the second surface 210B has a plurality of protuberances P forming a rough surface. Accordingly, not only can the light absorption rate be reduced when light passes through the GaN substrate 210, the total internal reflection effect generated at the second surface 210B can also be lowered when light passes through the GaN substrate 210, thereby enhancing the power of light. It should be noted that, the second surface 210B of the GaN substrate 210 having the plurality of protuberances P formed thereon is especially conducive to enhancing a power extraction of a particular wavelength. Specifically, an enhancement effect is especially noticeable for a wavelength range of 375 nm to 415 nm of the light emitted by the light emitting layer 230.

In particular, by using the structure of the LED 200 depicted in FIG. 1A is used as an example, schematic diagrams of a fabrication process of the LED 200 having the structure of the afore-described GaN substrate 210 are provided. Moreover, laboratory results of a GaN substrate capable of implementing the aforementioned characteristics are provided, although the embodiments below do not limit the disclosure.

FIGS. 3A-3E are schematic cross-sectional views of a fabricating process of an LED according to an exemplary embodiment. Referring to FIG. 3A, a GaN substrate 210 is provided, in which a gallium surface (Ga-face) of the GaN substrate 210 serves as the first surface 210A for forming a predetermined device thereon. A nitride surface (N-face) of the GaN substrate 210, the second surface 210B serves as a light emitting surface (depicted in FIG. 3D). Thereafter, referring to FIG. 3B, film layers such as the first type semiconductor layer 220 including the undoped GaN layer 220a and the second n-type doped GaN layer 220c, the light emitting layer 230, and the second type semiconductor layer 240 are formed in sequence on the first surface 210A of the GaN substrate 210. Next, referring to FIG. 3C, by using chip fabrication processes a plurality of LEDs 200 depicted in FIG. 1 are formed on the first surface 210A of the GaN substrate 210, in which each of the LEDs 200 includes the GaN substrate 210, the first type semiconductor layer 220, the light emitting layer 230, second type semiconductor layer 240 including the first p-type doped GaN layer 240a and the second p-type doped GaN layer 240b, the first electrode 250, and the second electrode 260.

It should be noted that, a fabrication technique can be employed for thinning the thickness of the GaN substrate 210, so a thickness D1 of the GaN substrate 210 is reduced to a thickness D2, in which the thickness D2 after thinning the GaN substrate 210 is approximately between 70-120 μm. The method for thinning the thickness may be a mechanical polishing method or an etching method, for example. Accordingly, the absorption effect of the emitted light from the light emitting layer 230 when passing through the GaN substrate 210 can be initially lowered, thus enhancing the power extraction.

Thereafter, referring to FIG. 3D, the N-face (i.e., a predetermined forming surface 210b of the second surface 210B) of the GaN substrate 210 is etched by a wet etching technique, so as to form a plurality of protuberances P on the N-face of the GaN substrate 210. Accordingly, the plurality of protuberances P on the second surface 210B can be used to reduce the total internal reflection effect when light is emitted from the GaN substrate 210 interface, thereby further enhancing the power extraction. The detailed structures of the plurality of protuberances P formed on the second surface 210B are described later. Next, referring to FIG. 3E, the GaN substrate 210 is divided to form a plurality of LEDs 200 with high power extraction. It should be obvious that, in another embodiment, the GaN substrate 210 may be first divided to form the plurality of LEDs 200, and then the wet etching technique is performed on the divided GaN substrate 210 for thinning the thickness of the GaN substrate 210 so as to form the LED in the disclosure, although the fabrication process of the LED is not limited thereto in the disclosure.

Moreover, it should be noted that, the power extraction and the luminous intensity of the LED 200 can be effectively enhanced by adjusting the plurality of protuberances P on the second surface 210B of the GaN substrate 210. Specifically, in the present embodiment, by using a KOH solution with a concentration of 2M for etching the N-face of the GaN substrate 210, for example, the plurality of protuberances P formed on the second surface 210B of the GaN substrate 210 after etching are sawtooth shaped pyramids, for instance. It should be obvious that, persons skilled in the art may select sulfuric acid or other etching solutions to perform the wet etch process. Moreover, by adjusting the variety, concentration, and the etch time of the selected etch solution, a height and a distribution density of the plurality of protuberances P on the second surface 210B can be controlled. Particularly, in the GaN substrate of the LED in the disclosure, when the height and the distribution density of protuberances P on the second surface satisfy a condition, a total reflection angle of the emitted light from the LED can be effectively adjusted, and a preferable power extraction can be achieved.

Figure 4A:
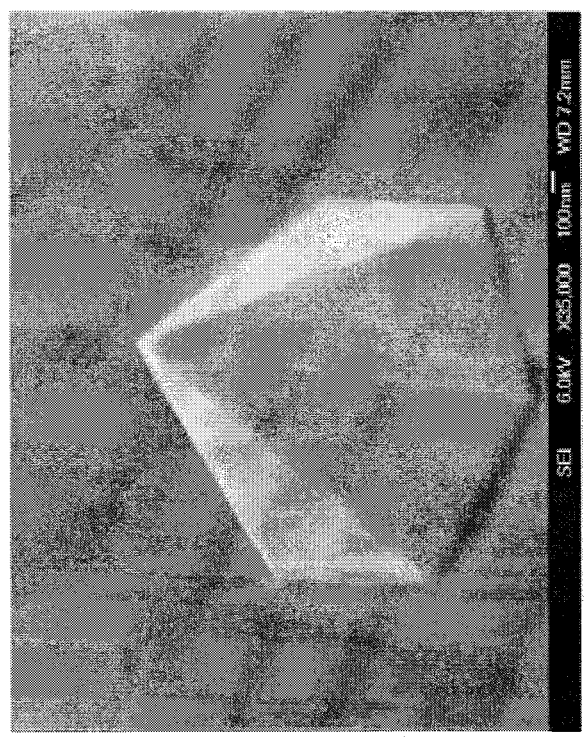
FIG. 4A illustrates a protuberance after the N-face of the GaN substrate has been etched.
Figure 4B:
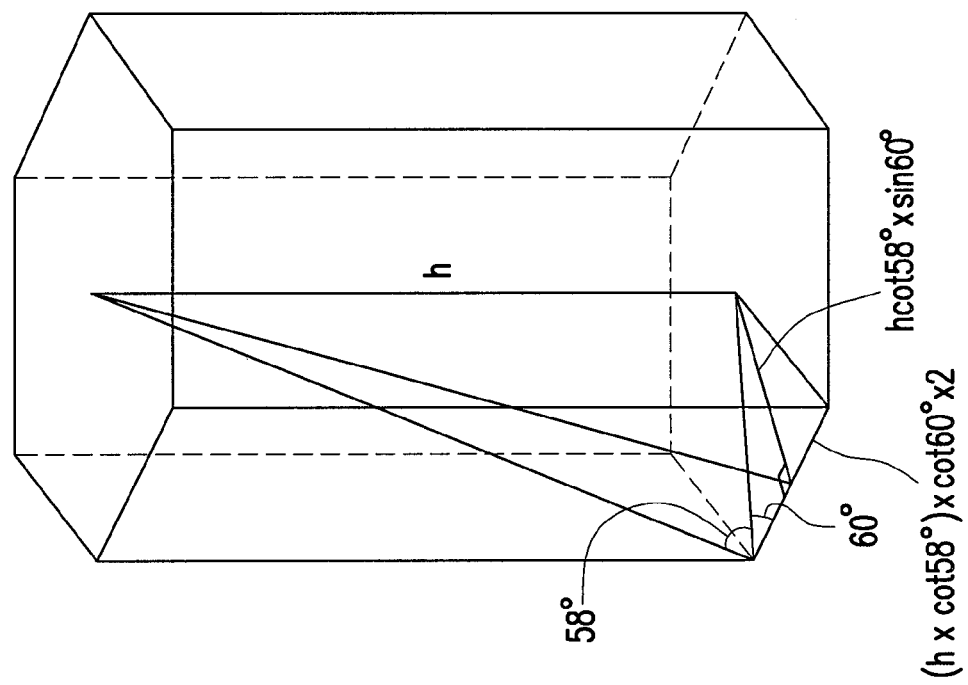
FIG. 4B is an schematic view for complementing the description of a calculation of a height of a protuberance on the N-face of the GaN substrate and a distribution density of the protuberances on the second surface.

In more specifics, please refer to FIGS. 4A and 4B. FIG. 4A illustrates a protuberance P having a pyramidal shape after the N-face of the GaN substrate has been etched. According to the lattice arrangement of the GaN substrate, each of the formed pyramids displays a hexagonal pyramid shape, and a characteristic angle of 58 degrees is included between the apex and the bottom surface of each pyramid.

As shown in FIG. 4B, the included angle between the pyramid apex and the bottom surface can be known to be 58 degrees according to the lattice arrangement of the N-face of the GaN substrate. Therefore, when the height of the protuberance is h μm, a height of one of the triangles forming the bottom surface is h×cot 58°×sin 60°. Moreover, a base of one of the triangles forming the bottom surface is (h×cot 58°)×cos 60°×2. Accordingly, an area of the bottom surface of the pyramid can be calculated as a total area of six of the aforementioned triangles 6×1/2×(h×cot 58°×sin 60°)×(2×cos 60°)×(h×cot 58°), and therefore the area of the bottom surface of pyramid is 6×h²×cot² 58°×sin 60° cos 60°.

In a unit area of 1 cm², the distribution density d cm⁻² of the pyramid can be derived by dividing the unit area by the area of the bottom surface of the pyramid. In other words, the distribution density d of the protuberances on the unit area can be calculated as d=(10⁴×10⁴)/(6×h²×cot² 58°×sin 60° cos 60°). That is to say, in theory the relationship between height h of the protuberances and the distribution density d of the protuberances on the second surface can be calculated as h²d= (10⁴×10⁴)/(6×cot² 58°×sin 60° cos 60°).

It should be noted that, the above calculation is a theoretically calculated value based on the pyramids being arranged in a most sparse manner in the unit area. Therefore, the height h of the protuberances in the second surface and the distribution density d of the protuberances on the second surface should satisfy the condition: 9.87×10⁷≤h²d.

Table 1 lists a plurality of experiments for forming the second surface 210B having the protuberances P on the GaN substrate 210 according to an exemplary embodiment. Moreover, Table 1 exhibits the etch time and the relationship of the vertical heights and the distribution density of the protuberances P formed after the etching. FIGS. 5A-5F are scanning electron microscope (SEM) measurement photos corresponding to each experiment in Table 1.

TABLE 1

| Experiment | Etch Time (Minutes) | Average Vertical Height of Pyramid P (μm) | Average Distribution Density of Pyramid P (cm⁻²) | SEM Photo |
| --- | --- | --- | --- | --- |
| A | Unetched | 0 | 0 | FIG. 5A |
| B | 1 | 0.25~0.35 | 8 × 10⁹~9 × 10⁹ | FIG. 5B |
| C | 5 | 0.7~1.0 | 1 × 10⁹~2 × 10⁹ | FIG. 5C |
| D | 10 | 0.9~1.8 | 8 × 10⁸~1.5 × 10⁹ | FIG. 5D |
| E | 30 | 3.0~5.5 | 6.0 × 10⁶~7.5 × 10⁶ | FIG. 5E |
| F | 60 | 4.0~6.0 | 1.5 × 10⁶~2.5 × 10⁶ | FIG. 5F |

As shown in Table 1 and FIGS. 5A-5F, the distribution density of the plurality of protuberances P becomes more sparse as the etch time increased, and the height of the protuberances increases as the etch time increased.

FIGS. 6A-6C respectively illustrates simulation views of the far-field angle of an LED having different types of protuberances formed by different etch times according to an exemplary embodiment. FIG. 6A is a far-field angle simulation view of the LED having the protuberances depicted in FIG. 5B with 1 minute etch time as shown in Table 1. FIG. 6B is a far-field angle simulation view of the LED having the protuberances depicted in FIG. 5D with 10 minute etch time as shown in Table 1. FIG. 6C is a far-field angle simulation view of the LED having the protuberances depicted in FIG. 5E with 30 minute etch time as shown in Table 1. As shown by FIGS. 6A-6C, after 1, 10, and 30 minutes, the LEDs in the disclosure achieves power extractions of 66.7%, 62.8%, and 51.5%, respectively. Accordingly, the LED in the disclosure has favorable power extraction, and the light extraction rate (power extraction) increases as the height of the pyramids decreases and the distribution density increases.

Figure 7:
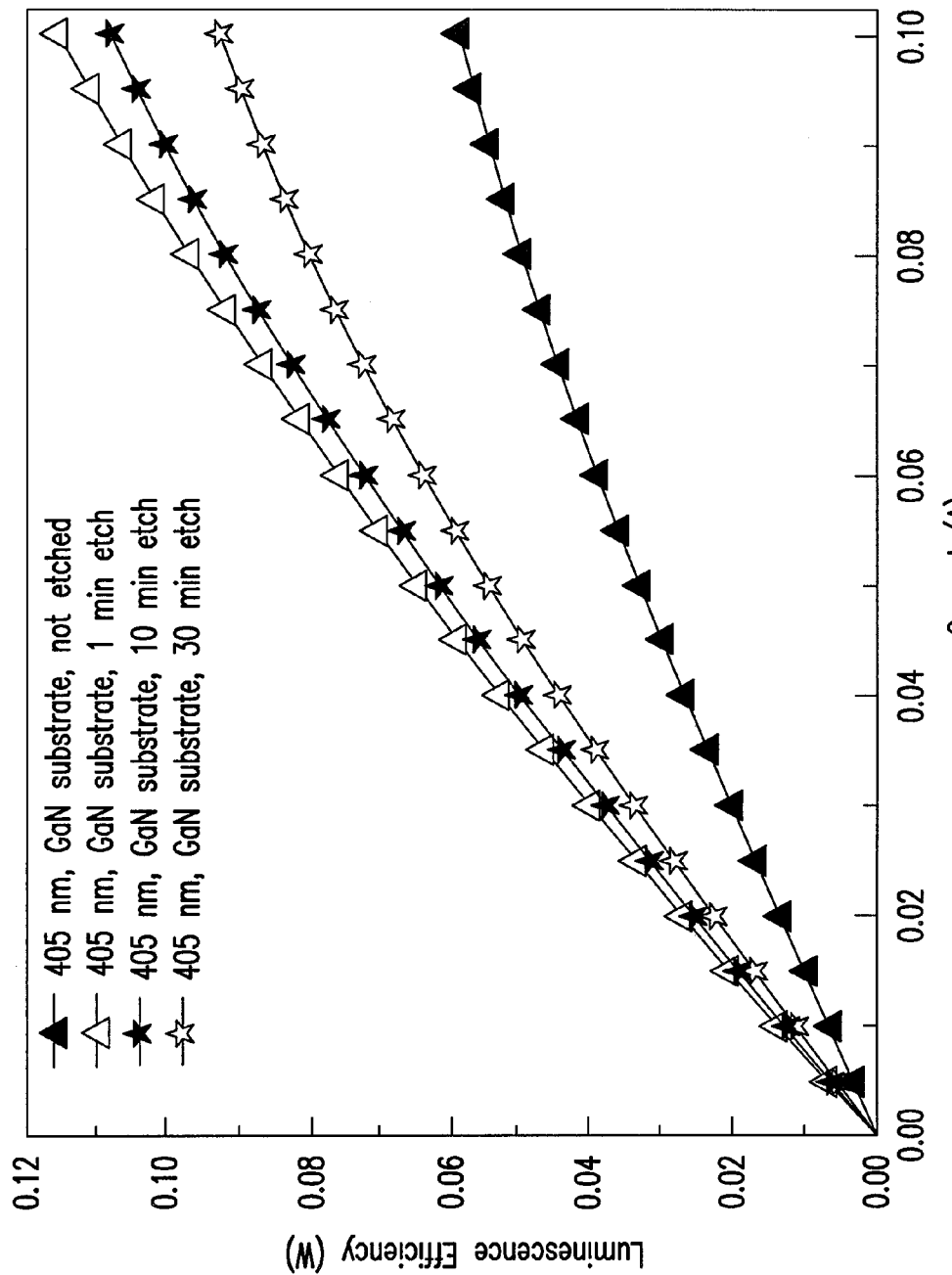
FIG. 7 illustrates a relationship of the etch time relative to an injection current to the LED and the luminous intensity, according to an exemplary embodiment adopting second surfaces having different types of protuberances formed by different etch times.

Moreover, when the second surface having the plurality of protuberances is formed on light emitting surface of the GaN substrate, the overall power extraction of the LED can be enhanced. The power extraction is especially favorable for light having wavelength of approximately 405 nm. FIG. 7 illustrates a relationship of the etch time relative to an injection current to the LED and the luminous intensity, according to an exemplary embodiment adopting second surfaces having different types of protuberances formed by different etch times. The horizontal axis of FIG. 7 represents different injection currents (units: amperes), the vertical axis represents the luminous intensity (units: watts), and the different line segments represent the different etch times executed. In the etch condition, a KOH solution with a 2M concentration is used, the temperature is at least 55° C., for example 80° C., and the etch times are respectively 1, 10, and 30 minutes. The results are tabulated in Table 2 below.

TABLE 2

| Wavelength of Emitted Light from LED 200 | Substrate | Etch Time (min) | Luminous Intensity (mW) |
|---|---|---|---|
| 405 nm | GaN substrate 210 | 0 | 13.1 |
|  |  | 1 | 27.2 |
|  |  | 10 | 25.6 |
|  |  | 30 | 22.7 |

As shown from Table 2 above, after executing 1 minute of the etch process on the light emitting surface of the GaN substrate, the original luminous intensity of 13.1 mW when the emitted wavelength of the LED is 405 nm is increased approximately two times to 27.2 mW. By looking at the LED structure, an especially favorable luminous intensity results when the height of the protuberances P is between 250 nm to 350 nm and the distribution density is between $8 \times 10^9$ to $9 \times 10^9$ cm$^{-2}$.

FIGS. 8A and 8B are optical performance diagrams of the far-field angle relative of an LED adopting the second surface having different types of protuberances formed by the different etch times listed in Table 2. The horizontal axis of FIG. 8A represents different viewing angles (unit: degrees), and the vertical axis represents the luminous intensity (unit: a.u.). In FIG. 8A, the different types of line segments, line segments A (rectangles), B (circles), C (triangles), and D (stars) respectively represents not etched, etched for 1 minute, etched for 10 minutes, and etched for 30 minutes. Moreover, the vertical axis of FIG. 8B represents the normalized luminous intensity. The different types of dots in FIG. 8B, A (rectangles), B (circles), C (triangles), and D (stars) respectively represents not etched, etched for 1 minute, etched for 10 minutes, and etched for 30 minutes. As shown in FIGS. 8A and 8B, after the GaN substrate has been etched, the luminous intensities at different viewing angles are all increased, with etching for 1 minute exhibiting the strongest intensity, and the effect agrees with FIG. 7.

Table 3 tabulates the luminescence efficiencies of an LED using GaN as substrate under different etch times according to an exemplary embodiment. Moreover, Table 3 also lists the luminescence efficiencies of an LED using the conventional sapphire as substrate for comparison. In the etch condition, a KOH solution with a 2M concentration is used, and the etch times are 10 minutes and not etched. The results are tabulated in Table 3 below.

TABLE 3

| Wavelength of Emitted Light from LED 200 | Substrate | Etch Time (min) | Luminous Intensity (mW) |
|---|---|---|---|
| 405 nm | Sapphire Substrate | 0 | 19.1 |
|  | GaN substrate | 0 | 13.2 |
|  | GaN substrate | 10 | 25.6 |
| 450 nm | Sapphire Substrate | 0 | 19.9 |
|  | GaN substrate | 0 | 18.6 |
|  | GaN substrate | 10 | 24.0 |

As shown in Table 3 above, when the GaN substrate is used in the LED, luminous intensity when the emitted wavelength of the LED is 405 nm can jump from 13.2 mW to 25.6 mW. As for light having wavelength of 450 nm, the luminous intensity thereof can be enhanced from 18.6 mW to 24.0 mW. Therefore, compared to LEDs using sapphire substrates, the LED in the disclosure has favorable luminescence efficiency over the conventional LED using the sapphire substrate. Hence, by fabricating a plurality of protuberances P on the N-face of the GaN substrate, and having the height and distribution density of the protuberances P satisfy the aforementioned conditions, the total reflection angle can be effectively adjusted and the power extraction can be enhanced.

Moreover, since the light absorption effect of the GaN substrate is higher than the sapphire substrate, thus as shown by the tables above, the power extraction of the LED using the GaN substrate without the etch process forming the protuberances P is lower than the power extraction of the LED using the sapphire substrate. However, after the etch process forms the plurality of protuberances P, the power extraction of the LED using the GaN substrate is favorable over the power extraction of the LED using the sapphire substrate, and the enhancement effect is especially pronounced for the power extraction at a wavelength of 405 nm.

Figures 9A, 9B:
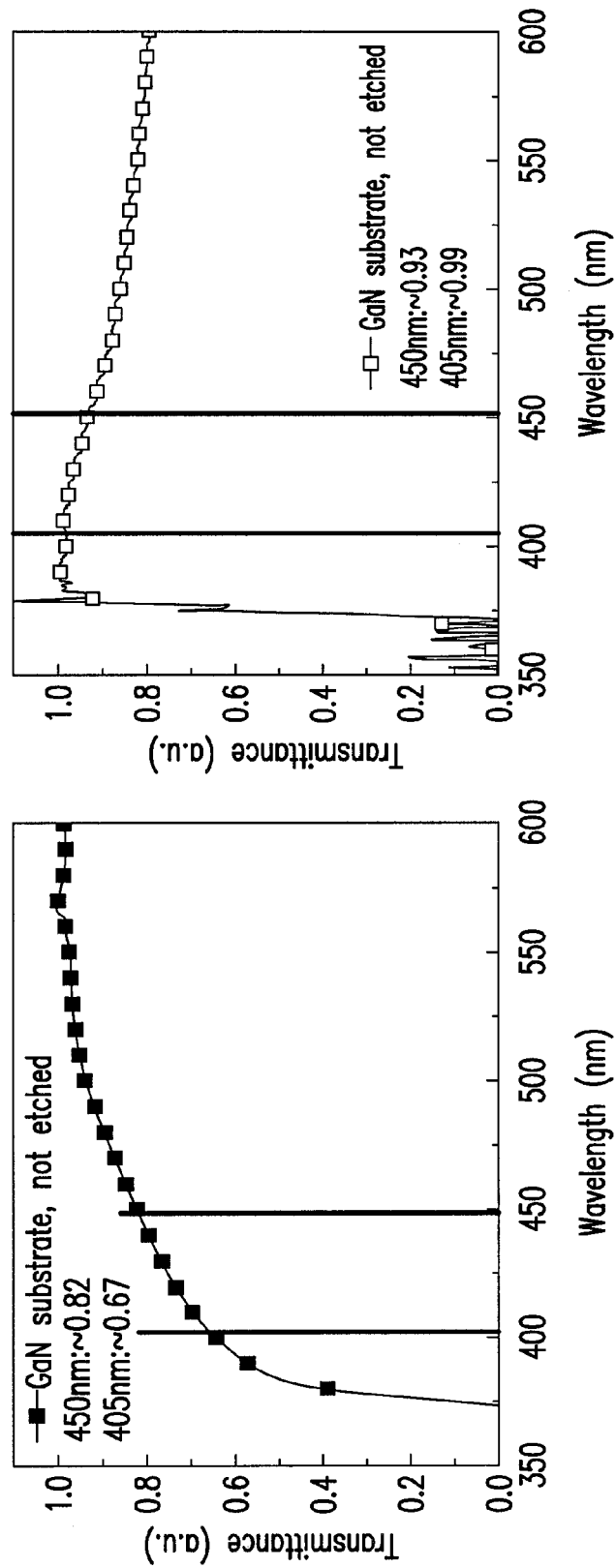
FIGS. 9A and 9B are curve diagrams respectively illustrating the relationships of the GaN substrate in an LED relative to the wavelength and the transmittance according to an exemplary embodiment.

FIGS. 9A and 9B are curve diagrams respectively illustrating the relationships of the GaN substrate in an LED relative to the wavelength and the transmittance according to an exemplary embodiment. FIG. 9A is a curve diagram illustrating a relationship of the wavelength and the transmittance when the GaN substrate in the LED is not etched, and FIG. 9B is a curve diagram illustrating a relationship of the wavelength and the transmittance when the GaN substrate in the LED has been etched. Referring first to FIG. 9A, for the LED having the unetched GaN substrate, the transmittance at wavelength of 405 nm is lower than the transmittance at wavelength of 450 nm. Specifically, the transmittance at wavelength of 405 nm is lower than the transmittance at wavelength of 450 nm by approximately 19%. In other words, the luminous intensity at wavelength of 405 nm is lower than the luminous intensity at wavelength of 450 nm. Therefore, after the 405 nm light emitted by the light emitting layer passes through the GaN substrate, the absorption effect of the GaN substrate causes the reduced luminous intensity.

Referring to FIG. 9B, after the plurality of protuberances P are formed on the second surface of the GaN substrate by the aforementioned etch process, a pronounced comparison can be seen from FIGS. 9A and 9B between the transmittances before and after etching. The wet etching process can enhance the transmittance of wavelengths from 375 nm to 415 nm. For the transmittance of wavelength around 405 nm, the transmittance has been enhanced from being 19% lower than the transmittance at 450 nm to being approximately 6.5% higher. Therefore, after etching, the luminous intensity (25.6 mW) at 405 nm is greater than the luminous intensity (24.0 mW) at 450 nm for the LED having the GaN substrate.

In view of the foregoing, the disclosure describes by forming a plurality of protuberances on the N-face of the GaN substrate, and by satisfying the aforementioned conditions, the total reflection angle of the light emitted from the LED can be effectively adjusted to enhance the power extraction.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode (LED), comprising:
    a gallium nitride (GaN) substrate comprising a first surface and a second surface respectively disposed on two sides of the GaN substrate, the second surface has a plurality of protuberances, a height of the protuberances is h μm, and a distribution density of the protuberances on the second surface is d cm$^{-2}$, wherein $h^2d \geq 9.87 \times 10^7$, and $h \leq 1.8$;
    a first type semiconductor layer disposed on the first surface of the GaN substrate;
    a light emitting layer disposed on a partial region of the first semiconductor layer, and a wavelength of a light emitted by the light emitting layer is from 375 nm to 415 nm;
    a second type semiconductor layer disposed on the light emitting layer; and
    a first electrode and a second electrode, wherein the first electrode is disposed on a partial region of the first type semiconductor layer, and the second electrode is disposed on a partial region of the second type semiconductor layer.

2. The LED as claimed in claim 1, wherein a thickness of the GaN substrate is between 70 μm to 120 μm.

3. The LED as claimed in claim 1, wherein $0.25 \leq h \leq 1.8$.

4. The LED as claimed in claim 1, wherein $8 \times 10^8 \leq d \leq 9 \times 10^9$.

5. The LED as claimed in claim 1, wherein the second surface is a nitride surface of the GaN substrate.

6. An LED, comprising:
    a GaN substrate comprising a first surface and a second surface, wherein the first surface and the second surface are disposed on two sides of the GaN substrate, and the second surface has a plurality of protuberances, a height of the protuberances is h μm, and a distribution density of the protuberances on the second surface is d cm$^{-2}$, wherein $h^2d \geq 9.87 \times 10^7$, and $d \geq 8 \times 10^8$;
    a first type semiconductor layer disposed on the first surface of the GaN substrate;
    a light emitting layer disposed on a partial portion of the first type semiconductor layer, and a wavelength of a light emitted by the light emitting layer is from 375 nm to 415 nm;
    a second type semiconductor layer disposed on the light emitting layer; and
    a first electrode and a second electrode, wherein the first electrode is disposed on a partial region of the first type semiconductor layer, and the second electrode is disposed on a partial region of the second type semiconductor layer.

7. The LED as claimed in claim 6, wherein a thickness of the GaN substrate is between 70 μm to 120 μm.

8. The LED as claimed in claim 6, wherein $0.25 \leq h \leq 1.8$.

9. The LED as claimed in claim 6, wherein $8 \times 10^8 \leq d \leq 9 \times 10^9$.

10. The LED as claimed in claim 6, wherein the second surface is a nitride surface of the GaN substrate.

11. An LED, comprising:
    a GaN substrate comprising a first surface and a second surface, wherein the first surface and the second surface are disposed on two sides of the GaN substrate, and the second surface has a plurality of protuberances, a height of the protuberances is h μm, and a distribution density of the protuberances on the second surface is d cm$^{-2}$, wherein $3 \leq h \leq 6$, and $1.5 \times 10^6 \leq d \leq 7.5 \times 10^6$;
    a first type semiconductor layer disposed on the first surface of the GaN substrate;
    a light emitting layer disposed on a partial portion of the first type semiconductor layer, and a wavelength of a light emitted by the light emitting layer is from 375 nm to 415 nm;
    a second type semiconductor layer disposed on the light emitting layer; and
    a first electrode and a second electrode, wherein the first electrode is disposed on a partial region of the first type semiconductor layer, and the second electrode is disposed on a partial region of the second type semiconductor layer.

12. The LED as claimed in claim 11, wherein a thickness of the GaN substrate is between 70 μm to 120 μm.

13. The LED as claimed in claim 11, wherein the second surface is a nitride surface of the GaN substrate.

* * * * *